United States Patent [19]
Uchida

[11] Patent Number: 5,227,996
[45] Date of Patent: Jul. 13, 1993

[54] SEMICONDUCTOR MEMORY DEVICE HAVING WORD LINE DRIVER

[75] Inventor: Toshiya Uchida, Kawasaki, Japan
[73] Assignee: Fujitsu Limited, Kanagawa, Japan
[21] Appl. No.: 757,154
[22] Filed: Sep. 10, 1991
[30] Foreign Application Priority Data
Sep. 14, 1990 [JP] Japan .................. 2-244585
[51] Int. Cl.$^5$ ............................. G11C 5/06
[52] U.S. Cl. ........................... 365/72; 365/63; 365/230.06
[58] Field of Search ............. 365/63, 72, 230.06, 365/189.11

[56] References Cited

U.S. PATENT DOCUMENTS

| | | | |
|---|---|---|---|
| 4,319,342 | 3/1982 | Scheuerlein | 365/72 X |
| 4,481,609 | 11/1984 | Miguchi et al. | 365/72 X |
| 4,694,428 | 9/1987 | Matsumura et al. | 365/63 X |
| 4,782,465 | 11/1988 | Uchida | 365/72 |
| 4,992,981 | 2/1991 | Ganssloser et al. | 365/63 X |

*Primary Examiner*—Eugene R. LaRoche
*Assistant Examiner*—Do Hyum Yoo
*Attorney, Agent, or Firm*—Nikaido, Marmelstein, Murray & Oram

[57] ABSTRACT

A semiconductor memory device includes first and second word lines which extend in parallel to each other, at least one line activation signal line which extends perpendicularly to the first and second word lines, a device isolation region which extends perpendicularly to the first and second word lines, a first driver for activating the first word line and having a first impurity region provided adjacent to the device isolation region and connected to the word line activation signal line, a first gate electrode and a second impurity region connected to the first word line, a second driver for activating the second word line and comprising a third impurity region provided adjacent to the device isolation region on an opposite side from the first impurity region and connected to the word line activation signal line, a second gate electrode and a fourth impurity region connected to the second word line, and a decoder connected to the first and second gate electrodes.

14 Claims, 8 Drawing Sheets

SEMICONDUCTOR MEMORY DEVICE HAVING WORD LINE DRIVER

BACKGROUND OF THE INVENTION

The present invention generally relates to semiconductor memory devices, and more particularly to a semiconductor memory device having a word line driver for driving word lines.

There are demands to improve the integration density of semiconductor memory devices, and attempts have been made to reduce the size of unit elements forming a semiconductor memory device such as a dynamic random access memory device (DRAM). In order to reduce the size of the unit element, that is, the dynamic memory cell, it is possible to take measures such as reducing the gate length, reducing the thickness of the gate oxide layer and reducing the width of the device isolation.

When the gate length or the thickness of the gate oxide layer is reduced, it is necessary to reduce the voltage which is applied to the element proportionally to the scaling rule.

However, a circuit such as the word decoder of the semiconductor memory device must have a sufficiently high withstand voltage because a relatively large voltage is applied to such a circuit. For this reason, there is a limit to reducing the gate length and the device isolation in such a circuit.

On the other hand, when reducing the size of the cell, it is also necessary to reduce the interval of the word lines. Accordingly, in the case of the word decoder which selects word lines, for example, it becomes necessary to reduce the width of the unit circuit of the word driver columns forming the word decoder depending on the interval of the word lines.

Next, a description will be given of an example of a word line driver of a conventional semiconductor memory device, by referring to FIGS. 1 through 3. FIG. 1 shows the word line driver in a plan view, FIG. 2 shows the word line driver in a cross section taken along a line A—A in FIG. 1, and FIG. 3 shows the word line driver in a cross section taken along a line B—B in FIG. 1.

The word line driver shown in FIG. 1 is provided with two boost signal lines 100 and 200 because this word line driver uses a word line activation signal which is predecoded with respect to the word decoder. The word line driver is made up of N-channel metal oxide semiconductor (MOS) transistors.

Word lines 50, 52, 54, 56, 58 and 60 for outputting signals to a memory cell array (not shown) extend parallel to each other. The boost signal lines 100 and 200 extend perpendicularly to these word lines 50 through 60.

In a region between the two boost signal lines 100 and 200, device isolation regions 7, 7' and 7" are formed in parallel to the word lines 50 through 60. The device isolation region 7 is formed between the word lines 54 and 56, the device isolation region 7' is formed between the word lines 50 and 52, and the device isolation region 7" is formed between the word lines 58 and 60. Element regions 8, 8', 9 and 9' extend in parallel to the word lines 50 through 60. The device isolation 7' isolates the element regions 8 an 9', the device isolation 7 isolates the element regions 8 and 9, and the device isolation 7" isolates the element regions 8' and 9. A driver 1 is formed within the element region 9', drivers 2 and 3 are formed within the element region 8, drivers 4 and 5 are formed within the element region 9, and a driver 6 is formed within the element region 8'. Each of the drivers 1 through 6 are made up of MOS field effect transistors (MOSFETs) respectively having a gate electrode formed between a source region and a drain region.

The driver 2 includes a drain region 32 for inputting a word line activation signal from the boost signal line 100, a gate electrode 80, and a source region 20 which is coupled to the word line 50 via a word line contact 12. The driver 3 includes a drain region 32 for inputting a word line activation signal from the boost signal line 100, a gate electrode 82, and a source region 21 which is coupled to the word line 54 via a word line contact 10. The driver 6 includes a drain region 36 for inputting a word line activation signal from the boost signal line 100, a gate electrode 84, and a source region 22 which is coupled to the word line 58 via a word line contact 13. The drain region 32 which is connected to the boost signal line 100 is used in common by the drivers 2 and 3, as shown in FIGS. 2 and 3.

On the other hand, the driver 1 includes a drain region 38 for inputting a word line activation signal from the boost signal line 200, a gate electrode 86 and a source region 23 which is coupled to the word line 52 via a word line contact 14. The driver 4 includes a drain region 42 for inputting a word line activation signal from the boost signal line 200, a gate electrode 88, and a source region 24 which is coupled to the word line 56 via a word line contact 11. The driver 5 includes a drain region 42 for inputting a word line activation signal from the boost signal line 200, a gate electrode 90, and a source region 25 which is coupled to the word line 60 via a word line contact 15. The drain region 42 which is connected to the boost signal line 200 is used in common by the drives 4 and 5, as shown in FIGS. 2 and 3.

The word lines 50 through 60 are respectively coupled to the memory cell array (not shown) which is provided above the boost signal line 100 in FIG. 1. On the other hand, a decoder (not shown) is provided below the boost signal line 200 in FIG. 1.

The gate electrode 86 of the driver 1 and the gate electrode 80 of the driver 2 are connected in common to a signal line 70 from the decoder. The gate electrode 82 of the driver 3 and the gate electrode 88 of the driver 4 are connected in common to a signal line 72 from the decoder. In addition, the gate electrode 90 of the driver 5 and the gate electrode 84 of the driver 6 are connected in common to a signal line 74 from the decoder.

Because the word line driver has the structure described above, it is possible to control two word lines using one decoder. In this specification, a width occupied by the drivers used by one decoder will be referred to as "one decoder pitch". Accordingly, it is possible to further reduce the size of the elements if this "one decoder pitch" can be reduced.

In order to guarantee a sufficient withstand voltage between the elements with respect to the voltage applied to the boost signal lines 100 and 200, it is necessary to provide the device isolation region 7 between the word lines 54 and 56 which respectively transfer outputs of the drivers 3 and 4. The width of this device isolation region 7 along the direction in which the "one decoder pitch" is taken must be sufficiently large such that a sufficient withstand voltage is guaranteed between the elements. For this reason, there are problems in that the gate length of the drivers 3 and 4 cannot be set sufficiently large with respect to the voltage applied to the boost signal lines 100 and 200, and that the source-drain withstand voltage of the drivers 3 and 4 becomes poor.

On the other hand, when the gate length of the drivers 3 and 4 is set sufficiently large with respect to the voltage applied to the boost signal lines 100 and 200, there are problems in that the width of the device isolation region 7 along the direction in which the "one decoder pitch" is taken cannot be made sufficiently large with respect to the voltage applied to the boost signal lines 100 and 200, and that the withstand voltage of the element becomes poor. Therefore, a problem is introduced from the point of view of the reliability of the elements, and this problem becomes more serious as the size of the elements is further reduced.

SUMMARY OF THE INVENTION

Accordingly, it is a general object of the present invention to provide a novel and useful semiconductor memory device in which the problems described above are eliminated.

Another and more specific object of the present invention is to provide a semiconductor memory device comprising a first word line, a second word line which extends in parallel to the first word line, word line activation signal line means which extends perpendicularly to the first and second word lines, a device isolation region which extends perpendicularly to the first and second word lines, a first driver for activating the first word line and comprising a first impurity region provided adjacent to the device isolation region and connected to the word line activation signal line means, a first gate electrode and a second impurity region connected to the first word line, a second driver for activating the second word line and comprising a third impurity region provided adjacent to the device isolation region on an opposite side from the first impurity region and connected to the word line activation signal line means, a second gate electrode and a fourth impurity region connected to the second word line, and a decoder connected to the first and second gate electrodes. According to the semiconductor memory device of the present invention, it narrow decoder pitch with a layout which guarantees a sufficiently high reliability.

Other objects and further features of the present invention will be apparent from the following detailed description when read in conjunction with the accompanying drawings.

DESCRIPTION OF THE PREFERRED EMBODIMENTS

First, a description will be given of a first embodiment of a semiconductor memory device according to the present invention, by referring to FIGS. 4 through 8.

Figure 1:
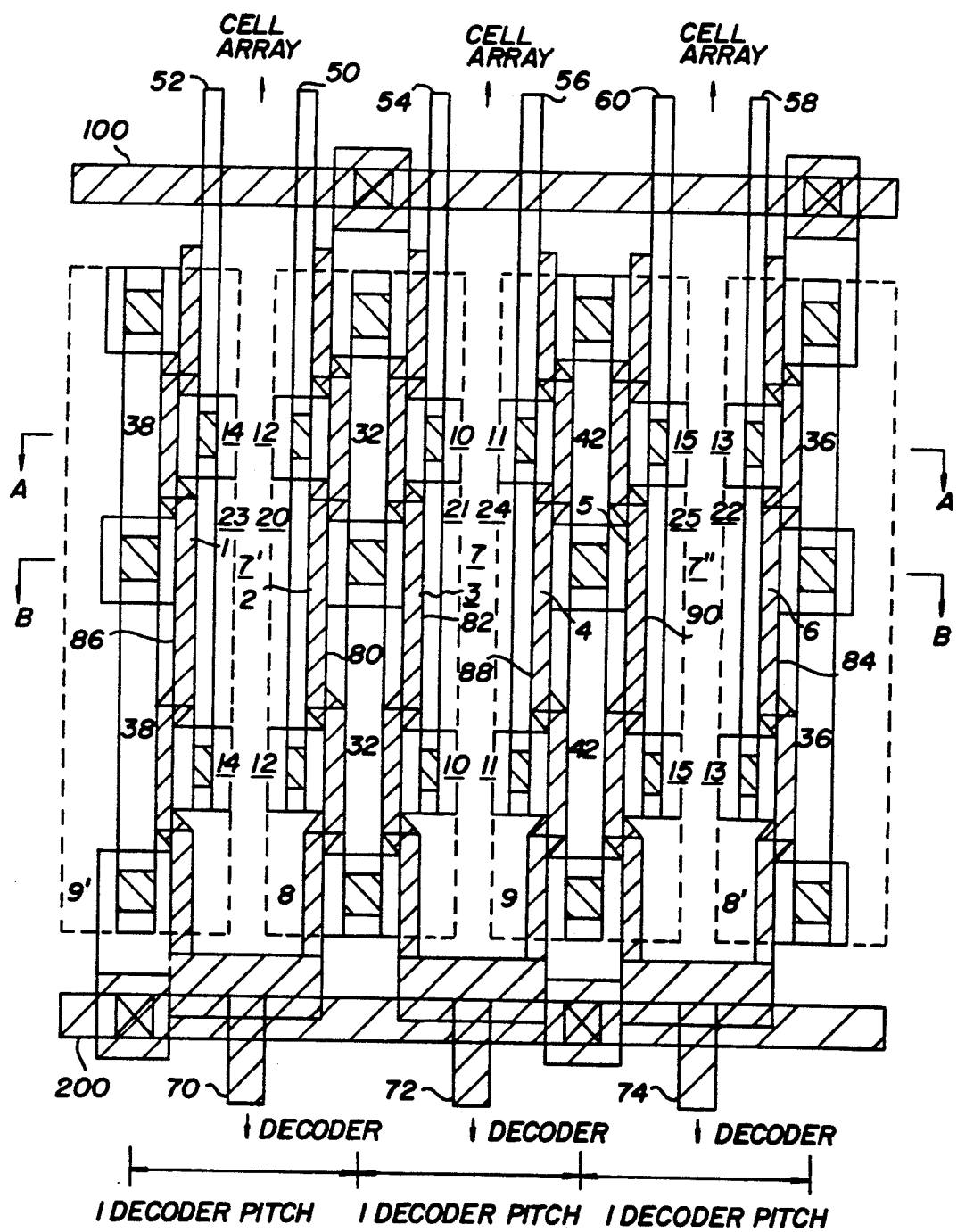
FIG. 1 is a plan view showing an essential part of a word line driver of an example of a conventional semiconductor memory device.
Figure 2:
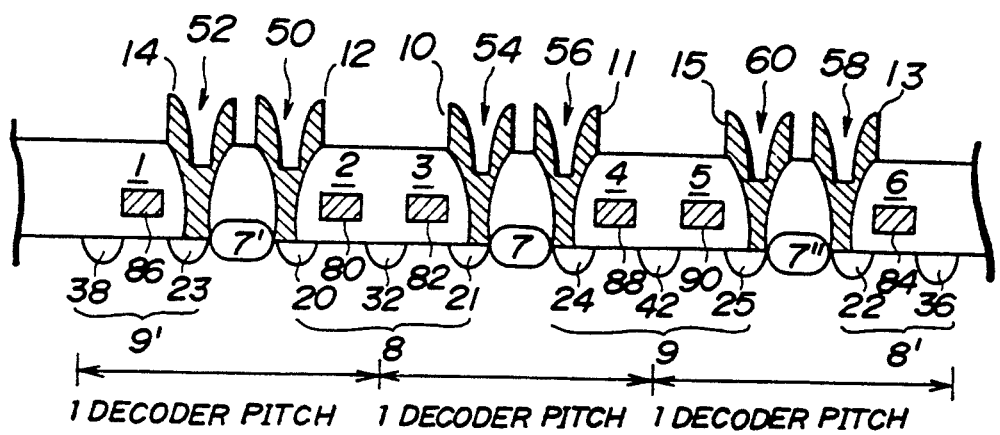
FIG. 2 is a cross sectional view showing the word line driver along a line A—A in FIG. 1.
Figure 3:
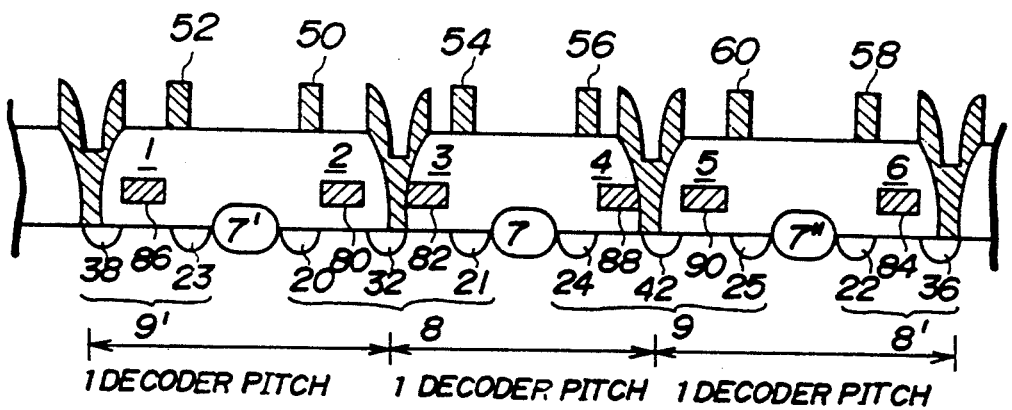
FIG. 3 is a cross sectional view showing the word line driver along a line B—B in FIG. 1.
Figure 4:
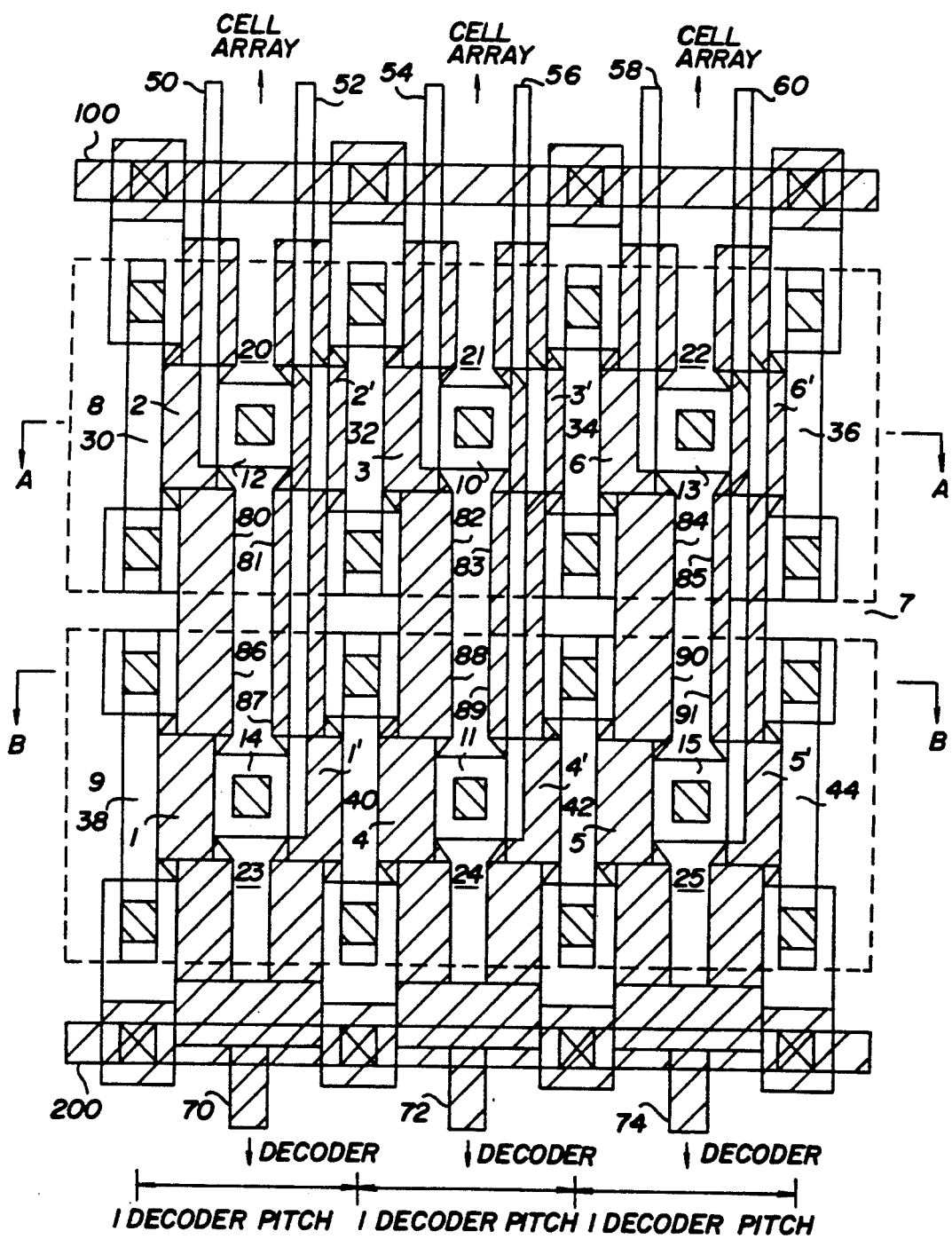
FIG. 4 is a plan view showing an essential part of a word line driver of a first embodiment of a semiconductor memory device according to the present invention.
Figure 5:
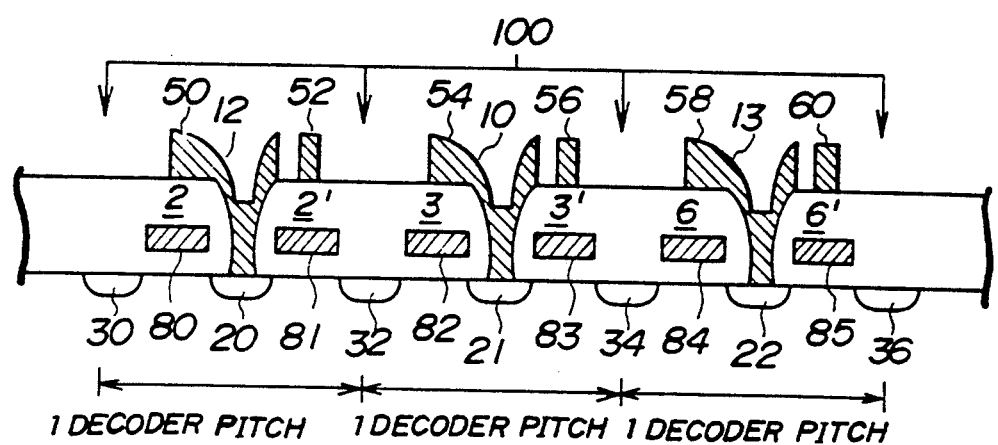
FIG. 5 is a cross sectional view showing the word line driver along a line A—A in FIG. 4.
Figure 6:
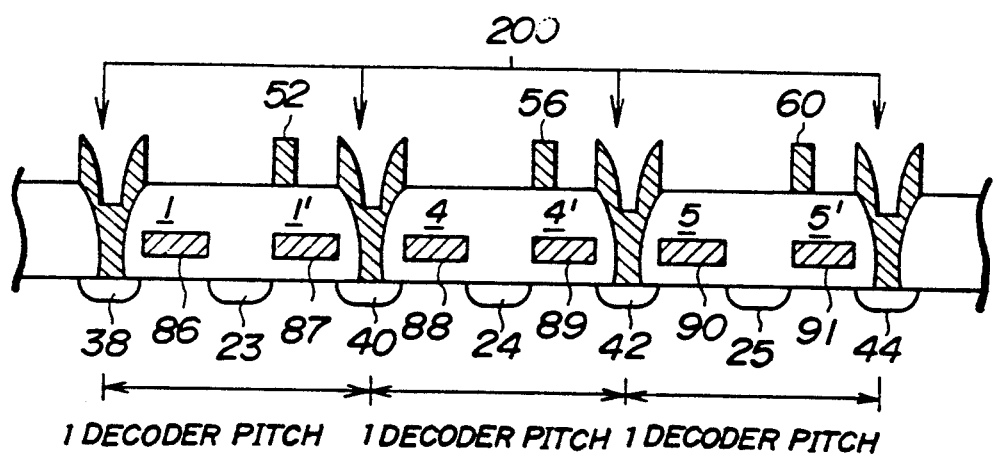
FIG. 6 is a cross sectional view showing the word line driver along a line B—B in FIG. 4.

FIG. 4 shows a word line driver of the first embodiment of the semiconductor memory device according to the present invention in a plan view, FIG. 5 shows the word line driver in a cross section taken along a line A—A in FIG. 4, and FIG. 6 shows the word line driver in a cross section taken along a line B—B in FIG. 4. In FIGS. 4 through 6, those parts which are the basically same as those corresponding parts in FIGS. 1 through 3 are designated by the same reference numerals.

In this embodiment, the word line driver is provided with two boost signal lines 100 and 200 because the word line driver uses a word line activation signal which is predecoded with respect to a word decoder.

Word lines 50, 52, 54, 56, 58 and 60 for outputting signals to a memory cell array (not shown) extend parallel to each other. The boost signal lines 100 and 200 extend perpendicularly to these word lines 50 through 60.

A device isolation region 7 is provided at an intermediate part between the two boost signal lines 100 and 200, and this device isolation region 7 extends perpendicularly to the word lines 50 through 60. An element region 8 is formed between the device isolation region 7 and the boost signal line 100, and an element region 9 is formed between the device isolation region 7 and the boost signal line 200.

Drivers 2, 2', 3, 3', 6 and 6' are formed within the element region 8.

The driver 2 includes a drain region 30 for inputting a word activation signal from the boost signal line 100, a gate electrode 80 and a source region 20 which is coupled to the word line 50 via a word line contact 12. The driver 2' includes a drain region 32 for inputting a word activation signal from the boost signal line 100, a gate electrode 81 and the source region 20 which is coupled to the word line 50 via the word line contact 12. The drivers 2 and 2' form a transistor pair using the source region 20 in common.

The driver 3 includes the drain region 32 for inputting a word activation signal from the boost signal line 100, a gate electrode 82 and a source region 21 which is coupled to the word line 54 via a word line contact 10. The driver 3' includes a drain region 34 for inputting a word activation signal from the boost signal line 100, a gate electrode 83 and the source region 21 which is coupled to the word line 54 via the word line contact 10. The drivers 3 and 3' form a transistor pair using the source region 21 in common.

The driver 6 includes a drain region 34 for inputting a word activation signal from the boost signal line 100, a gate electrode 84 and a source region 22 which is coupled to the word line 58 via a word line contact 13. The driver 6' includes a drain region 36 for inputting a word activation signal from the boost signal line 100, a gate electrode 85 and the source region 22 which is coupled to the word line 58 via the word line contact 13. The drivers 6 and 6' form a transistor pair using the source region 22 in common.

As shown in FIGS. 4 and 5, the drain region 32 which is connected to the boost signal line 100 is used in common by the drivers 2' and 3, and the drain region 34 is used in common by the drivers 3' and 6.

Drivers 1, 1', 4, 4', 5 and 5' are formed within the element region 9.

The driver 1 includes a drain region 38 for inputting a word activation signal from the boost signal line 200, a gate electrode 86 and a source region 23 which is coupled to the word line 52 via a word line contact 14. The driver 1' includes a drain region 40 for inputting a word activation signal from the boost signal line 200, a gate electrode 87 and the source region 23 which is coupled to the word line 52 via the word line contact 14. The drivers 1 and 1' form a transistor pair using the source region 23 in common.

The driver 4 includes the drain region 40 for inputting a word activation signal from the boost signal line 200, a gate electrode 88 and a source region 24 which is coupled to the word line 56 via a word line contact 11. The driver 4' includes a drain region 42 for inputting a word activation signal from the boost signal line 200, a gate electrode 89 and the source region 24 which is coupled to the word line 56 via the word line contact 11. The drivers 4 and 4' form a transistor pair using the source region 24 in common.

The driver 5 includes a drain region 42 for inputting a word activation signal from the boost signal line 200, a gate electrode 90 and a source region 25 which is coupled to the word line 60 via a word line contact 15. The driver 5' includes a drain region 44 for inputting a word activation signal from the boost signal line 200, a gate electrode 91 and the source region 25 which is coupled to the word line 60 via the word line contact 15. The drivers 5 and 5' form a transistor pair using the source region 25 in common.

As shown in FIGS. 5 and 6, the drain region 40 which is connected to the boost signal line 200 is used in common by the drivers 1' and 4, and the drain region 42 is used in common by the drivers 4' and 5.

The word lines 50 through 60 connect to the memory cell array (not shown) which is provided above the boost signal line 100 in FIG. 4. On the other hand, the decoder (not shown) is provided below the boost signal line 200 in FIG. 4.

The gate electrode 80 of the driver 2 and the gate electrode 86 of the driver 1 are connected. The gate electrode 81 of the driver 2' and the gate electrode 87 of the driver 1' are connected. Further, the two gate electrodes 86 and 87 are connected in common to a signal line 70 from the decoder.

The gate electrode 82 of the driver 3 and the gate electrode 88 of the driver 4 are connected. The gate electrode 83 of the driver 3' and the gate electrode 89 of the driver 4' are connected. The two gate electrodes 88 and 89 are connected in common to a signal line 72 from the decoder.

The gate electrode 84 of the driver 6 and the gate electrode 90 of the driver 5 are connected. The gate electrode 85 of the driver 6' and the gate electrode 91 of the driver 5' are connected. The two gate electrodes 90 and 91 are connected in common to a signal line 74 from the decoder.

This embodiment employs the so-called $\frac{1}{4}$ predecoding in which two word lines are controlled by a single decoder. Hence, the "one decoder pitch" required to control a pair of word lines 54 and 56, for example, is the length between the drain regions 32 and 34 or the drain regions 40 and 42.

Next, a description will be given of an operation of this embodiment of the semiconductor memory device, by referring to FIG. 7 which shows an equivalent circuit of an essential part of this embodiment.

Figure 7:
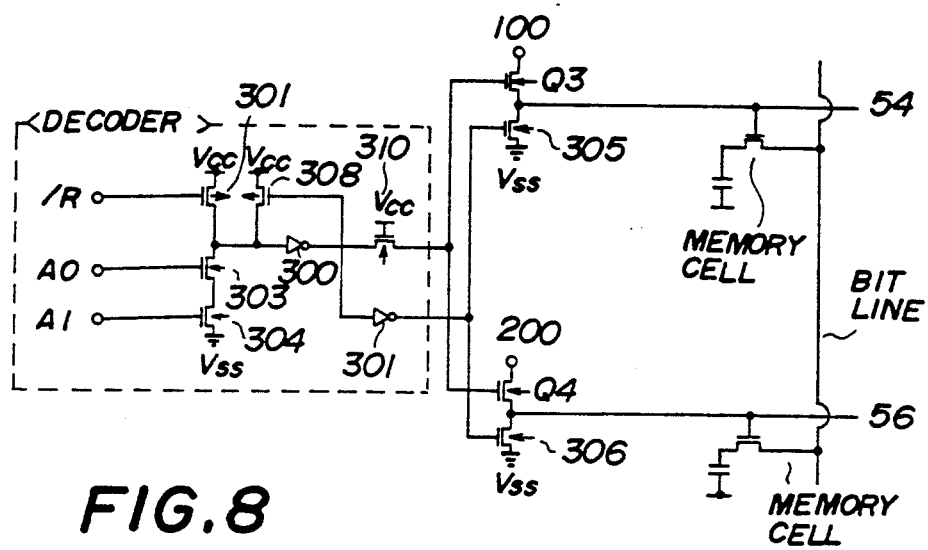
FIG. 7 is a circuit diagram showing an equivalent circuit of an essential part of the first embodiment when N-channel MOS transistors are used.

In the equivalent circuit shown in FIG. 7, the driver circuit includes a decoder circuit and a word line driver using N-channel MOS transistors. Since this embodiment employs the $\frac{1}{4}$ predecoding, the equivalent circuit shows the circuitry within "one decode pitch" which is necessary to control a pair of word lines 54 and 56, for example.

The word line 54 is connected to an N-channel transistor Q3 for inputting the word line activation signal from the boost signal line 100. The word line 56 is connected to an N-channel transistor Q4 for inputting the word line activation signal from the boost signal line 200. The N-channel transistor Q3 corresponds to the drivers 3 and 3', and the N-channel transistor Q4 corresponds to the drivers 4 and 4'.

The gate electrode of the N-channel transistor Q3 is connected to the gate electrode of the N-channel transistor Q4, and is coupled to an inverter 300 via a cut gate 310 within a decoder part which is surrounded by a dotted line. The gate electrode of an N-channel transistor 305 is connected to the gate electrode of an N-channel transistor 306, and is coupled to the inverter 300 via an inverter 301 within the decoder part.

The inverter 300 is connected to an N-channel transistor 303 and a P-channel transistor 307.

A signal A0 from a predecoder (not shown) is input to the gate electrode of the N-channel transistor 303. A signal A1 from the predecoder is input to the gate electrode of an N-channel transistor 304 which is connected in series to the N-channel transistor 303. A reset signal /R is input to the gate electrode of the P-channel transistor 307.

The drain of a P-channel transistor 308 is connected to a node which connects the inverter 300 and the N-channel transistor 303. In addition, a node which connects the inverter 300 and the cut gate 310 is connected to the gate electrode of the P-channel transistor 308.

Bits of a memory address for making access to a memory cell, other than the three least significant bits, are decoded in the predecoder (not shown) which is provided in a stage preceding the decoder part. The signals A0 and A1 which are input to the decoder part respectively correspond to the second and third least significant bits of the memory address. The word line activation signal from the boost signal lines 100 and 200 for driving the N-channel transistors Q3 and Q4 corresponds to the least significant bit of the memory address.

The pair of word lines 54 and 56 is selected only when both the input signals A0 and A1 are high-level signals. When the word line activation signal from the boost signal line 100 or 200 has a high level, the word line 54 or 56 is selected.

In other words, when both the input signals A0 and A1 are high-level signals, the signal level at the gate electrodes of the N-channel transistors Q3 and Q4 become high and the signal level at the gate electrodes of the N-channel transistors 305 and 306 becomes low. In this state, when the signal level of the word line activation signal from the boost signal line 100 becomes high, the word line 54 is selected to the high level because the N-channel transistor Q3 is ON. Because the boost signal lines 100 and 200 correspond to the least significant bit of the memory address, the signal level of the boost signal line 200 becomes low when the signal level at the boost signal line 100 is high, and although the N-channel transistor Q4 is ON, the signal level at the word line 56 is low. On the other hand, when the signal level at the boost signal line 100 is low, the word line activation signal from the boost signal line 200 has the high level, and the word line 56 is selected via the N-channel transistor Q4. The desired memory cell is selected in the above described manner.

Figure 8:
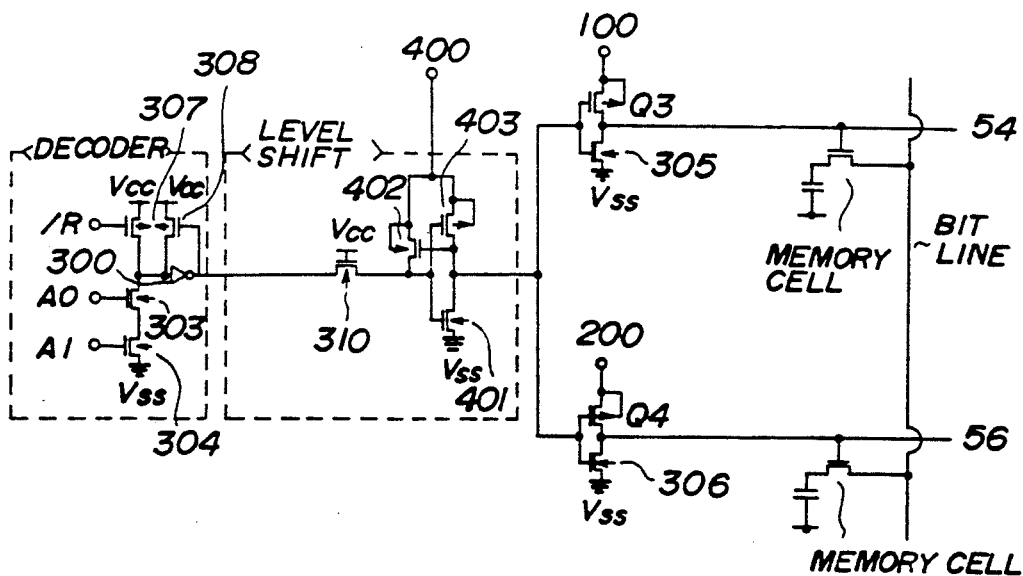
FIG. 8 is a circuit diagram showing an equivalent circuit of an essential part of the first embodiment when P-channel MOS transistors are used.

The driver circuit of this embodiment may also be formed using P-channel MOS transistors. FIG. 8 shows an equivalent circuit of an essential part of this embodiment.

In the equivalent circuit shown in FIG. 8, the driver circuit includes a decoder circuit and a word line driver using P-channel MOS transistors. Particularly, the P-channel MOS transistors are used for the drivers 3, 3', 4 and 4'. In FIG. 8, those parts which are basically the same as those corresponding parts in FIG. 7 are designated by the same reference numerals, and a description thereof will be omitted.

In FIG. 8, the word line 54 is connected to a P-channel transistor Q3 for inputting the word line activation signal from the boost signal line 100. The word line 56 is connected to a P-channel transistor Q4 for inputting the word line activation signal from the boost signal line 200. The P-channel transistor Q3 corresponds to the drivers 3 and 3', and the P-channel transistor Q4 corresponds to the drivers 4 and 4'.

The gate electrodes of the P-channel transistors Q3 and Q4 and the gate electrodes of the N-channel transistors 305 and 306 are connected to a CMOS circuit of a level shift part which is surrounded by a dotted line. The CMOS circuit of the level shift part includes an N-channel transistor 401 and a P-channel transistor 403, and a voltage identical to the voltage of the word line activation signal from the P-channel transistors Q3 and Q4 is supplied to the gate electrodes. The P-channel transistor 403 and a P-channel transistor 402 are connected to a boost voltage source 400. The P-channel transistor 402 and the CMOS circuit are coupled to the inverter 300 of the decoder part via the cut gate 310.

The inverter 300 is connected to the N-channel transistor 303 and the P-channel transistor 307.

A signal A0 from a predecoder (not shown) is input to the gate electrode of the N-channel transistor 303. A signal A1 from the predecoder is input to the gate electrode of an N-channel transistor 304 which is connected in series to the N-channel transistor 303. A reset signal /R is input to the gate electrode of the P-channel transistor 307.

The drain of the P-channel transistor 308 is connected to a node which connects the inverter 300 and the N-channel transistor 303. In addition, a node which connects the inverter 300 and the cut gate 310 is connected to the gate electrode of the P-channel transistor 308.

According to this embodiment, it is possible to eliminate the device isolation region which conventionally existed in parallel with the word lines within the "one decoder pitch". In addition, although two word line contacts conventionally existed in a direction perpendicular to the word lines within the "one decoder pitch", only one word line contact is required within the "one decoder pitch" according to this embodiment. Accordingly, a sufficient margin is introduced in the width of the semiconductor memory device along the direction in which the "decoder pitch" is taken, and it becomes possible to ensure a sufficient gate length for the word line driver.

On the other hand, since the device isolation region extends perpendicularly to the word lines, the "decoder pitch" does not increase even when the width of the device isolation region increases.

Figure 9:
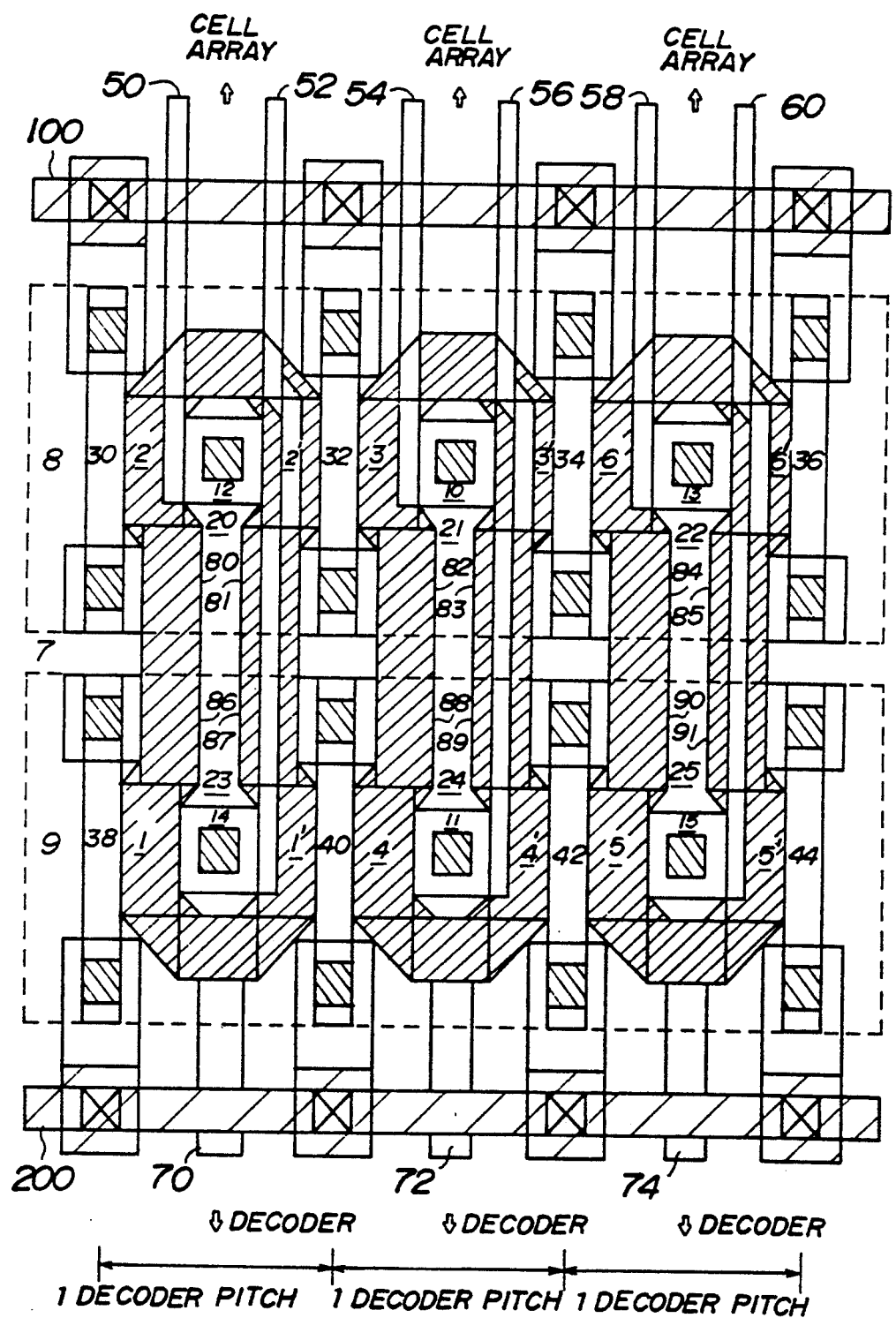
FIG. 9 is a plan view showing an essential part of a word line driver of a second embodiment of the semiconductor memory device according to the present invention.

Next, a description will be given of a second embodiment of the semiconductor memory device according to he present invention, by referring to FIG. 9. In FIG. 6, those parts which are the same as those corresponding parts in FIG. 4 are designated by the same reference numerals, and a description thereof will be omitted.

This embodiment is characterized by the modified shape of the gate electrodes of the drivers when compared to the first embodiment. In other words, in FIG. 9 in which the drivers 1 through 6 and 1' through 6' form transistors in pairs, ends of the gate electrodes of the driver pair are connected in an approximate U-shape. The gate electrodes 86 and 87 of the drivers 1 and 1' are connected to surround the word line contact 14 of the source region 23. The gate electrodes 80 and 81 of the drivers 2 and 2' are connected to surround the word line contact 12 of the source region 20. The gate electrodes 82 and 83 of the drivers 3 and 3' are connected to surround the word line contact 10 of the source region 21. The gate electrodes 88 and 89 of the drivers 4 and 4' are connected to surround the word line contact 11 of the source region 24. The gate electrodes 90 and 91 of the drivers 5 and 5' are connected to surround the word line contact 15 of the source region 25. The gate electrodes 84 and 85 of the drivers 6 and 6' are connected to surround the word line contact 13 of the source region 22.

Therefore, it is possible to further reduce the interval of the two boost signal lines 100 and 200.

Figure 10:
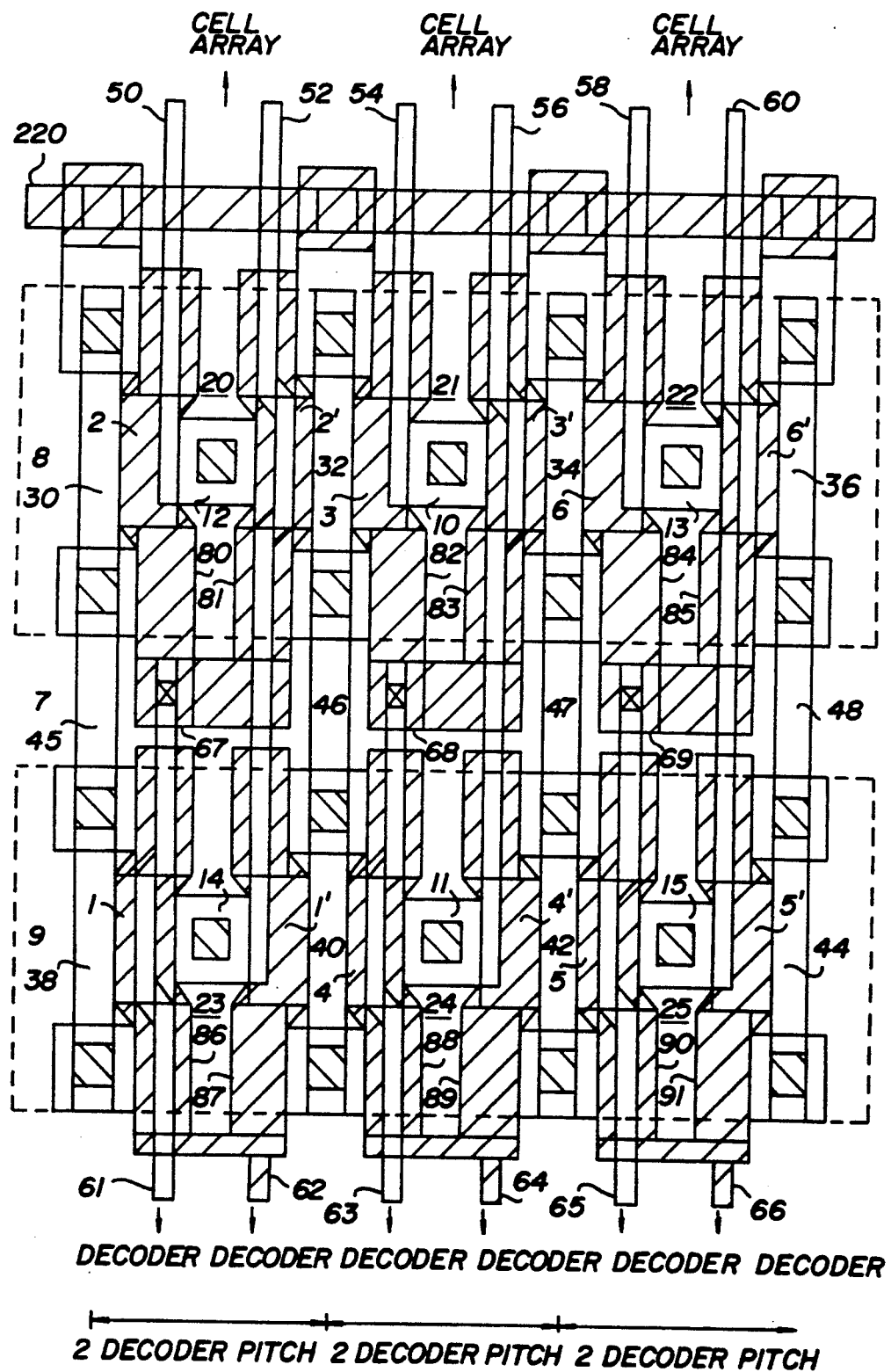
FIG. 10 is a plan view showing an essential part of a word line driver of a third embodiment of the semiconductor memory device according to the present invention.
Figure 11:
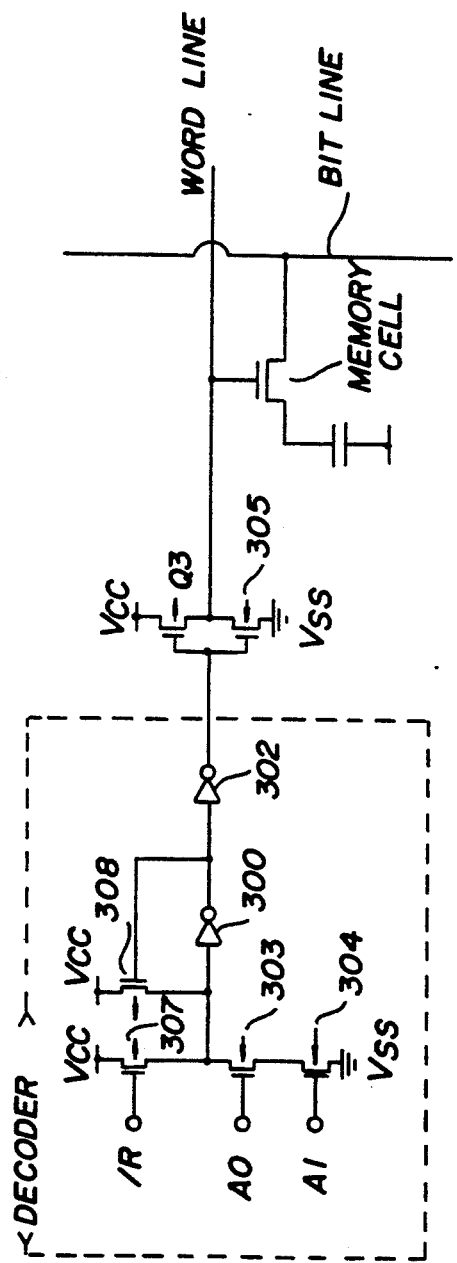
FIG. 11 is a circuit diagram showing an equivalent circuit of an essential part of the third embodiment when P-channel MOS transistors are used.

Next, a description will be given of a third embodiment of the semiconductor memory device according to the present invention, by referring to FIGS. 10 and 11. FIG. 10 shows a word line driver of the third embodiment in a plan view, and FIG. 11 shows an equivalent circuit of an essential part of the third embodiment. In FIG. 10, those parts which are the same as those corresponding parts in FIG. 4 are designated by the same reference numerals, and a description thereof will be omitted. Further, in FIG. 11, those parts which are the same as those corresponding parts in FIGS. 7 and 8 are designated by the same reference numerals, and a description thereof will be omitted.

This embodiment is characterized in that no predecoding using the boost signal line is made and that a single decoder is provided with respect to one word line.

In this embodiment, the word line driver is formed from P-channel MOS transistors.

In FIG. 10, the word lines 50, 52, 54, 56, 58 and 60 for outputting signals to a memory cell array (not shown) are provided in parallel to each other. The memory cell array is provided above an external power source line 220 in FIG. 10, and this external power source line 220 extends perpendicularly to the word lines 50 through 60.

The element regions 8 and 9 extend perpendicularly to the word lines 50 through 60 on the opposite side from the memory cell array relative to the external power source line 220. The device isolation region 7 extends between the element regions 8 and 9.

The drivers 2, 2', 3, 3', 6 and 6' are formed within the element region 8.

The driver 2 includes a source region 30' which is connected to the external power source line 220, a gate electrode 80, and a drain region 20' which is coupled to the word line 50 via a word line contact 12. The driver 2' includes a source region 32' which is connected to the external power source line 220, a gate electrode 81, and the drain region 20' which is coupled to the word line 50 via the word line contact 12. The drivers 2 and 2' form a transistor pair using the drain region 20' in common.

The driver 3 includes a source region 32' which is connected to the external power source line 220, a gate electrode 82, and a drain region 21' which is coupled to the word line 54 via a word line contact 10. The driver 3' includes a source region 34' which is connected to the external power source line 220, a gate electrode 83, and the drain region 21' which is coupled to the word line 54 via the word line contact 10. The drivers 3 and 3' form a transistor pair using the drain region 21' in common.

The driver 6 includes a source region 34' which is connected to the external power source line 220, a gate electrode 84, and a drain region 22' which is coupled to the word line 58 via a word line contact 13. The driver 6' includes a source region 36' which is connected to the external power source line 220, a gate electrode 85, and the drain region 22' which is coupled to the word line 58 via the word line contact 13. The drivers 6 and 6' form a transistor pair using the drain region 22' in common.

The source region 32' which is connected to the external power source line 220 is used in common by the drivers 2' and 3. The source region 34, is used in common y the drivers 3' and 6.

The drivers 1, 1', 4, 4', 5 and 5' are formed within the element region 9.

The driver 1 includes a source region 38' which is coupled to the external power source line 220 by a connection line 45 via the source region 30', a gate electrode 86, and a drain region 23' which is coupled to the word line 52 via a word line contact 14. The driver 1' includes a source region 40' which is coupled to the external power source line 220 by a connection line 46 via the source region 32', a gate electrode 87, and the drain region 23' which is coupled to the word line 52 via the word line contact 14. The drivers 1 and 1' form a transistor pair using the drain region 23' in common.

The driver 4 includes a source region 40' which is coupled to the external power source line 220 by the connection line 46 via the source region 32', a gate electrode 88, and a drain region 24' which is coupled to the word line 56 via a word line contact 11. The driver 4' includes a source region 42' which is coupled to the external power source line 220 by a connection line 47 via the source region 34', a gate electrode 89, and the drain region 24' which is coupled to the word line 56 via the word line contact 11. The drivers 4 and 4' form a transistor pair using the drain region 24' in common.

The driver 5 includes a source region 42' which is connected to the external power source line 220 by the connection line 47 via the source region 34', a gate electrode 90, and a drain region 25' which is coupled to the word line 60 via a word line contact 15. The driver 5' includes a source region 44' which is coupled to the external power source line 220 by a connection line 48 via the source region 36', a gate electrode 91, and the drain region 25' which is coupled to the word line 60 via the word line contact 15. The drivers 5 and 5' form a transistor pair using the drain region 25' in common.

The source region 40' which is coupled to the external power source line 220 via the connection line 46 is used in common by the drivers 1' and 4. The source region 42' is used in common by the drivers 4' and 5.

The word lines 50 through 60 are respectively connected to the memory cell array which is provided above the external power source line 220 in FIG. 10.

In FIG. 10, the gate electrode 80 of the driver 2 and the gate electrode 81 of the driver 2' are integrally formed to surround the drain region 20', and are coupled to a signal line 61 from the decoder by a signal contact 67. The gate electrodes 82 and 83 of the drivers 3 and 3', the gate electrodes 84 and 85 of the drivers 6 and 6', the gate electrodes 86 and 87 of the drivers 1 and 1', the gate electrodes 88 and 89 of the drivers 4 and 4', and the gate electrodes 90 and 91 of the drivers 5 and 5' are formed similarly to the gate electrodes 80 and 81 of the drivers 2 and 2', and are coupled to corresponding signal lines 63, 65, 62, 64 and 66 from the decoder via respective signal contacts 68, 69, . . . .

In this embodiment, the word line driver does not make a predecoding. For this reason, the width corresponding to "one decoder pitch" of the first embodiment corresponds to the width of "two decoder pitches" of this third embodiment.

Next, a description will be given of an operation of this third embodiment, by referring to the equivalent circuit of FIG. 11.

In the equivalent circuit shown in FIG. 11, the driver circuit includes a decoder circuit and a word line driver using P-channel MOS transistors. Since this embodiment does not make a predecoding, the equivalent circuit shows the circuitry within "one decoder pitch" which is necessary to control one word line by one decoder.

The word line is connected to a P-channel transistor Q3 for inputting the word line activation signal (Vcc) from the external power source line 220. This P-channel transistor Q3 corresponds to each driver.

The gate electrode of the P-channel transistor Q3 is connected to the gate electrode of an N-channel transistor 305, and is coupled to an N-channel transistor 303 and a P-channel transistor 307 via inverters 302 and 300 within a decoder part surrounded by a dotted line.

A signal A0 from a predecoder (not shown) is input to the gate electrode of the N-channel transistor 303. A signal A1 from the predecoder is input to the gate electrode of an N-channel transistor 304 which is connected in series to the N-channel transistor 303. A reset signal /R is input to the gate electrode of the P-channel transistor 307.

The drain of a P-channel transistor 308 is connected to a node which connects the inverter 300 and the N- channel transistor 303. In addition, a node which connects the inverters 300 and 302 is connected to the gate electrode of the P-channel transistor 308.

Bits of a memory address for making access to a memory cell, other than the two least significant bits, are decoded in the predecoder (not shown) which is provided in a stage preceding the decoder part. The signals A0 and A1 which are input to the decoder part respectively correspond to the first and second least significant bits of the memory address.

The word line of the circuit shown in FIG. 11 is selected only when the signal level of both the input signals A0 and A1 is high.

When the input signals A0 and A1 are both high-level signals, the signal levels at the gate electrodes of the P-channel transistor Q3 and the N-channel transistor 305 become low. As a result, the signal level at the word line becomes high, and the desired memory cell is selected.

The first and second embodiments described above employ the ½ predecoding. However, these embodiments may employ other predecodings such as a ¼ predecoding in which four word lines are controlled by a single decoder.

Further, the present invention is not limited to these embodiments, but various variations and modifications may be made without departing from the scope of the present invention.

What is claimed is:

1. A semiconductor memory device comprising:
   a first word line;
   a second word line which extends in parallel to said first word line;
   word line activation signal line means which extends perpendicularly to said first and second word lines;
   a device isolation region which extends perpendicularly to said first and second word lines;
   a first driver for activating said first word line, said first driver comprising a first impurity region provided adjacent to said device isolation region and connected to said word line activation signal line means, a first gate electrode, and a second impurity region connected to said first word line;
   a second driver for activating said second word line, said second driver comprising a third impurity region provided adjacent to said device isolation region on an opposite side from the first impurity region and connected to said word line activation signal line means, a second gate electrode, and a fourth impurity region connected to said second word line; and
   a decoder connected to the first and second gate electrodes.

2. The semiconductor memory device as claimed in claim 1, wherein said word line activation signal line means includes first and second boost signal lines one of which transfers a word line activation signal at one time, said first impurity region of said first driver being connected to the first boost signal line, said third impurity region of said second driver being connected to the second boost signal line.

3. The semiconductor memory device as claimed in claim 2, wherein said device isolation region is provided at an intermediate position between the first and second boost signal lines.

4. The semiconductor memory device as claimed in claim 2, wherein said first and second drivers are arranged within a specific region defined by the first and second boost signal lines, and said decoder is provided outside the specific region on an outer side of the second boost signal line.

5. The semiconductor memory device as claimed in claim 4, which further comprises a memory cell array which is connected to said first and second word lines, said memory cell array being provided outside the specific region on an outer side of the first boost signal line.

6. The semiconductor memory device as claimed in claim 1, wherein said first driver includes two said first impurity regions and two said first gate electrodes, and said second driver includes two said third impurity regions and two said second gate electrodes, said first impurity regions and said first gate electrodes surrounding said second impurity region from both sides, said third impurity regions and said second gate electrodes surrounding said fourth impurity region from both sides;

7. The semiconductor memory device as claimed in claim 1, wherein said first driver includes two said first impurity regions, said second driver includes two said third impurity regions, said first gate electrode has an approximate U-shape surrounding said second impurity region, and said second gate electrode has an approximate U-shape surrounding said fourth impurity region.

8. The semiconductor memory device as claimed in claim 1, wherein said word line activation signal line means includes a single signal line which transfers a word line activation signal, and said first impurity region of said first driver is connected to the signal line.

9. The semiconductor memory device as claimed in claim 8, wherein said first driver is provided at an intermediate position between the signal line and said device isolation region.

10. The semiconductor memory device as claimed in claim 8, wherein said decoder is provided on one side of said second driver opposite to said device isolation region.

11. The semiconductor memory device as claimed in claim 10, which further comprises a memory cell array which is connected to said first and second word lines, said memory cell array being provided on an outer side of the signal line opposite to said first driver.

12. The semiconductor memory device as claimed in claim 8, wherein said first driver includes two said first impurity regions, said second driver includes two said third impurity regions, said first gate electrode has an approximate U-shape surrounding said second impurity region, and said second gate electrode has an approximate U-shape surrounding said fourth impurity region.

13. The semiconductor memory device as claimed in claim 1, which further comprises first and second element regions which extend perpendicularly to said first and second word lines on both sides of said device isolation region, said first driver being provided within said first element region, said second driver being provided within said second element region.

14. The semiconductor memory device as claimed in claim 13, wherein said first and second word lines form a first pair, said first and second drivers form a second pair, a plurality of the first pairs are arranged in a direction perpendicular to said word line activation signal line means, and a plurality of the second pairs are arranged in the direction perpendicular to said word line activation signal line means, each of said first drivers of the second pairs being formed within said first element region, each of said second drivers of the second pairs being formed within said second element region.

* * * * *

(12) EX PARTE REEXAMINATION CERTIFICATE (7510th)
United States Patent
Uchida

(10) Number: US 5,227,996 C1
(45) Certificate Issued: May 18, 2010

(54) SEMICONDUCTOR MEMORY DEVICE HAVING WORD LINE DRIVER

(75) Inventor: Toshiya Uchida, Kawasaki (JP)

(73) Assignee: Fujitsu Limited, Nakahara-Ku, Kawasaki-shi, Kanagawa (JP)

Reexamination Request:
No. 90/008,736, Jun. 29, 2007

Reexamination Certificate for:
| | |
|---|---|
| Patent No.: | 5,227,996 |
| Issued: | Jul. 13, 1993 |
| Appl. No.: | 07/757,154 |
| Filed: | Sep. 10, 1991 |

(30) Foreign Application Priority Data

Sep. 14, 1990 (JP) ............................................. 2-224585

(51) Int. Cl.
*G11C 5/06* (2006.01)

(52) U.S. Cl. .......................... 365/72; 365/63; 365/230.06
(58) Field of Classification Search .......................... None
See application file for complete search history.

(56) References Cited

U.S. PATENT DOCUMENTS

| 4,376,984 A | 3/1983 | Fukushima et al. |
| 4,982,372 A | 1/1991 | Matsuo |
| 5,159,215 A | 10/1992 | Murotani |
| 5,227,996 A | 7/1993 | Uchida |

OTHER PUBLICATIONS

Shizuo Chou et al., "A 60–ns 16–Mbit DRAM with a Minimized Sensing Delay Caused by Bit–Line Stray Capacitance", *IEEE Journal of Solid–State Circuits,* vol. 24, No. 5, Oct. 1989, pp. 1176–1183.

*Primary Examiner*—My-Trang Ton

(57) ABSTRACT

A semiconductor memory device includes first and second word lines which extend in parallel to each other, at least one line activation signal line which extends perpendicularly to the first and second word lines, a device isolation region which extends perpendicularly to the first and second word lines, a first driver for activating the first word line and having a first impurity region provided adjacent to the device isolation region and connected to the word line activation signal line, a first gate electrode and a second impurity region connected to the first word line, a second driver for activating the second word line and comprising a third impurity region provided adjacent to the device isolation region on an opposite side from the first impurity region and connected to the word line activation signal line, a second gate electrode and a fourth impurity region connected to the second word line, and a decoder connected to the first and second gate electrodes.

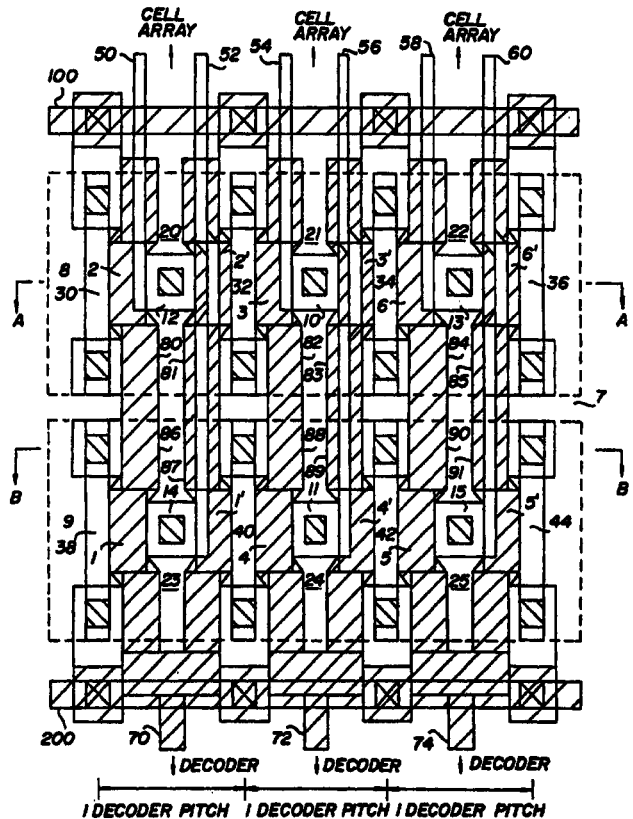

EX PARTE
REEXAMINATION CERTIFICATE
ISSUED UNDER 35 U.S.C. 307

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 1 is cancelled.

New claims 15–39 are added and determined to be patentable.

Claims 2–14 were not reexamined.

*15. A semiconductor memory device comprising:*
*a first word line which extends to connect to a memory cell array;*
*a second word line which extends in parallel to said first word line, to connect to said memory cell array;*
*word line activation signal line means which extends perpendicularly to said first and second word lines;*
*a device isolation region which extends perpendicularly to said first and second word lines;*
*a first driver for activating said first word line, said first driver comprising a first impurity region provided adjacent to said device isolation region and connected to said word line activation signal line means, a first gate electrode, and a second impurity region connected to said first word line;*
*a second driver for activating said second word line, said second driver comprising a third impurity region provided adjacent to said device isolation region on an opposite side from the first impurity region and connected to said word line activation signal line means, a second gate electrode, and a fourth impurity region connected to said second word line; and*
*a decoder connected to the first and second gate electrodes,*
*wherein said first and second drivers are arranged on the same side of said memory cell array, and said device isolation region is arranged between said first driver and said second driver; and*
*said second impurity region is connected to said first word line via a first word line contact, said fourth impurity region is connected to said second word line via a second word line contact, and said device isolation region is arranged between said first word line contact and said second word line contact.*

*16. A semiconductor memory device comprising:*
*a first word line which extends to connect to a memory cell array;*
*a second word line which extends in parallel to said first word line, to connect to said memory cell array;*
*word line activation signal line means which extends perpendicularly to said first and second word lines;*
*a device isolation region which extends perpendicularly to said first and second word lines;*
*a first driver for activating said first word line, said first driver comprising a first impurity region provided adjacent to said device isolation region and connected to said word line activation signal line means, a first gate electrode, and a second impurity region connected to said first word line;*
*a second driver for activating said second word line, said second driver comprising a third impurity region provided adjacent to said device isolation region on an opposite side from the first impurity region and connected to said word line activation signal line means, a second gate electrode, and a fourth impurity region connected to said second word line; and*
*a decoder connected to the first and second gate electrodes,*
*wherein said first and second drivers are arranged on the same side of said memory cell array, and said device isolation region is arranged between said first driver and said second driver; and*
*said first driver includes two said first impurity regions and two said first gate electrodes, one pair of said first impurity regions and first gate electrodes and the other pair thereof are arranged on both sides of said second impurity region, said second driver includes two said third impurity regions and two said second gate electrodes, one pair of said third impurity regions and second gate electrodes and the other pair thereof are arranged on both sides of said fourth impurity region.*

*17. A semiconductor memory device comprising:*
*a first word line which extends to connect to a memory cell array;*
*a second word line which extends in parallel to said first word line, to connect to said memory cell array;*
*word line activation signal line means which extends perpendicularly to said first and second word lines;*
*a device isolation region which extends perpendicularly to said first and second word lines;*
*a first driver for activating said first word line, said first driver comprising a first impurity region provided adjacent to said device isolation region and connected to said word line activation signal line means, a first gate electrode, and a second impurity region connected to said first word line;*
*a second driver for activating said second word line, said second driver comprising a third impurity region provided adjacent to said device isolation region on an opposite side from the first impurity region and connected to said word line activation signal line means, a second gate electrode, and a fourth impurity region connected to said second word line; and*
*a decoder connected to the first and second gate electrodes,*
*wherein said first and second drivers are arranged on the same side of said memory cell array, and said device isolation region is arranged between said first driver and said second driver; and*
*said first driver includes two said first impurity regions and two said first gate electrodes, said second driver includes two said third impurity regions and two said second gate electrodes, said first and second gate electrodes are connected to each other to form an approximate U-shape arranged on both sides of said second and fourth impurity regions.*

*18. A semiconductor memory device comprising:*
*a first word line which extends to connect to a memory cell array;* a second word line which extends in parallel to said first word line, to connect to said memory cell array;

word line activation signal line means which extends perpendicularly to said first and second word lines;

a device isolation region which extends perpendicularly to said first and second word lines;

a first driver for activating said first word line, said first driver comprising a first impurity region provided adjacent to said device isolation region and connected to said word line activation signal line means, a first gate electrode, and a second impurity region connected to said first word line;

a second driver for activating said second word line, said second driver comprising a third impurity region provided adjacent to said device isolation region on an opposite side from the first impurity region and connected to said word line activation signal line means, a second gate electrode, and a fourth impurity region connected to said second word line; and a decoder connected to the first and second gate electrodes, wherein said first and second drivers are arranged on the same side of said memory cell array, and said device isolation region is arranged between said first driver and said second driver; and said word line activation signal line means includes first and second activation signal lines, said first impurity region of said first driver is connected to the first activation signal line, said third impurity region of said second driver is connected to the second activation signal line.

19. The semiconductor memory device as claimed in claim 18, wherein said first and second activation signal lines correspond to an address.

20. The semiconductor memory device as claimed in claim 18, wherein said first gate electrode is connected to said second gate electrode, and said first and second gate electrodes are commonly connected to a signal line from said decoder.

21. A semiconductor memory device comprising:

a first word line which extends to connect to a memory cell array;

second, third and fourth word lines which extend in parallel to said first word line, to connect to said memory cell array;

word line activation signal line means which extends perpendicularly to said first, second, third and fourth word lines;

a device isolation region which extends perpendicularly to said first, second, third and fourth word lines;

a first driver for activating said first word line, said first driver comprising a first impurity region provided adjacent to said device isolation region and connected to said word line activation signal line means, a first gate electrode, and a second impurity region connected to said first word line;

a second driver for activating said second word line, said second driver comprising a third impurity region provided adjacent to said device isolation region on an opposite side from the first impurity region and connected to said word line activation signal line means, a second gate electrode, and a fourth impurity region connected to said second word line;

a third driver for activating said third word line, said third driver comprising said first impurity region provided adjacent to said device isolation region, a third gate electrode, and a fifth impurity region connected to said third word line;

a fourth driver for activating said fourth word line, said fourth driver comprising said third impurity region provided adjacent to said device isolation region on an opposite side from the first impurity region, a fourth gate electrode, and a sixth impurity region connected to said fourth word line;

a decoder having a first decoder circuit which is connected to the first and second gate electrodes; and the decoder having a second decoder circuit which is connected to the third and fourth gate electrodes, wherein said first, second, third and fourth drivers are arranged on the same side of said memory cell array, and said device isolation region is arranged between said first, third drivers and said second, fourth drivers.

22. The semiconductor memory device as claimed in claim 21, wherein said first, second, third and fourth word lines are adjacent word lines.

23. The semiconductor memory device as claimed in claim 21, further comprising first and second element regions which extend perpendicularly to said first, second, third and fourth word lines, arranged on both sides of said device isolation region, wherein said first and third drivers are provided within said first element region, said second and fourth drivers are provided within said second element region.

24. The semiconductor memory device as claimed in claim 21, wherein said first driver further comprises a seventh impurity region provided adjacent to said device isolation region and connected to said word line activation signal line means, a fifth gate electrode, said second driver further comprises an eighth impurity region provided adjacent to said device isolation region on an opposite side from the seventh impurity region and connected to said word line activation signal line means, and a sixth gate electrode, said first, second, fifth and sixth gate electrodes are connected to each other to form an approximate U-shape arranged on both sides of said second and fourth impurity regions, and said first decoder circuit is connected commonly to the first, second, fifth and sixth gate electrodes.

25. The semiconductor memory device as claimed in claim 24, wherein said first drivers comprises first and second transistors, said second drivers comprises third and fourth transistors, said first transistor comprises said first impurity region, said first gate electrode and said second impurity region, said second transistor comprises said seventh impurity region, said fifth gate electrode and said second impurity region, said third transistor comprises said third impurity region, said second gate electrode and said fourth impurity region, said fourth transistor comprises said eighth impurity region, said sixth gate electrode and said fourth impurity region.

26. The semiconductor memory device as claimed in claim 25, wherein said device isolation region is arranged between said first, second transistors and said third, fourth transistors.

27. The semiconductor memory device as claimed in claim 26, wherein said first and second transistors are arranged in parallel with said device isolation region, and said third and fourth transistors are arranged in parallel with said device isolation region.

28. A semiconductor memory device comprising:
- a first word line which extends to connect to a memory cell array;
- a second word line which extends in parallel to said first word line to connect to said memory cell array;
- word line activation signal line means having first and second activation signal lines which extend perpendicularly to said first and second word lines;
- a device isolation region which extends perpendicularly to said first and second word lines;
- a first driver, including first and second transistors for activating said first word line, said first transistor comprising a first impurity region provided adjacent to said device isolation region and connected to said first activation signal line, a first gate electrode, and a second impurity region connected to said first word line, said second transistor comprising a third impurity region provided adjacent to said device isolation region and connected to said first activation signal line, a second gate electrode, and said second impurity region connected to said first word line;
- a second driver, including third and fourth transistors, for activating said second word line, said third transistor comprising a fourth impurity region provided adjacent to said device isolation region on an opposite side from the first impurity region and connected to said second activation signal line, a third gate electrode, and a fifth impurity region connected to said second word line, said fourth transistor comprising a sixth impurity region provided adjacent to said device isolation region on an opposite side from the third impurity region and connected to said second activation signal line, a fourth gate electrode, and said fifth impurity region connected to said second word line; and
- a decoder, including a first decorder circuit commonly connected to the first, second, third and fourth gate electrodes,
- wherein said first and second drivers are arranged on the same side of said memory cell array, and said device isolation region is arranged between said first driver and said second driver.

29. The semiconductor memory device as claimed in claim 28, wherein said first and second word lines are adjacent word lines.

30. The semiconductor memory device as claimed in claim 28, wherein said first and second activation signal lines correspond to an address.

31. The semiconductor memory device as claimed in claim 28, wherein said first and third gate electrodes are connected directly to each other, and said second and fourth gate electrodes are connected directly to each other.

32. The semiconductor memory device as claimed in claim 28, further comprises first and second element regions, which extend perpendicularly to said first and second word lines, arranged on both sides of said device isolation region, wherein said first and second transistors are provided within said first element region, said third and fourth transistors are provided within said second element region.

33. The semiconductor memory device as claimed in claim 28, wherein said device isolation region is arranged between said first, second transistors and said third, fourth transistors.

34. The semiconductor memory device as claimed in claim 33, wherein said first and second transistors are arranged in parallel with said device isolation region, and said third and fourth transistors are arranged in parallel with said device isolation region.

35. The semiconductor memory device as claimed in claim 28, further comprising:
- third and fourth word lines which extend in parallel to said first and second word lines, to connect to said memory cell array;
- a third driver, including fifth and sixth transistors for activating said third word line, said fifth transistor comprising a seventh impurity region provided adjacent to said device isolation region and connected to said first activation signal line, a fifth gate electrode, and a eighth impurity region connected to said third word line, said sixth transistor comprising said first impurity region, a sixth gate electrode, and said eighth impurity region connected to said third word line; and
- a fourth driver, including seventh and eighth transistors, for activating said fourth word line, said seventh transistor comprising a ninth impurity region provided adjacent to said device isolation region on an opposite side from the seventh impurity region and connected to said second activation signal line, a seventh gate electrode, and said tenth impurity region connected to said fourth word line, said eighth transistor comprising said fourth impurity region, an eighth gate electrode, and said tenth impurity region connected to said fourth word line,
- wherein said decoder includes a second decoder circuit commonly connected to the fifth, sixth, seventh and eighth electrodes, and
- said first, second, third and fourth drivers are arranged on the same side of said memory cell array, and said device isolation region is arranged between said first, third drivers and said second, fourth drivers.

36. The semiconductor memory device as claimed in claim 35, wherein said fifth and seventh gate electrodes are connected directly to each other, and said sixth and eighth gate electrodes are connected directly to each other.

37. The semiconductor memory device as claimed in claim 35, further comprises first and second element regions, which extend perpendicularly to said first, second, third and fourth word lines, arranged on both sides of said device isolation region,
- wherein said first, second, fifth and sixth transistors are provided within said first element region, said third, fourth, seventh and eighth transistors are provided within said second element region.

38. The semiconductor memory device as claimed in claim 35, wherein said device isolation region is arranged between said first, second, fifth, sixth transistors and said third, fourth, seventh, eighth transistors.

39. The semiconductor memory device as claimed in claim 38, wherein said first, second, fifth and sixth transistors are arranged in parallel with said device isolation region, and said third, fourth, seventh and eighth transistors are arranged in parallel with said device isolation region.

* * * * *